United States Patent
Duvvury et al.

(10) Patent No.: US 7,145,204 B2
(45) Date of Patent: Dec. 5, 2006

(54) GUARDWALL STRUCTURES FOR ESD PROTECTION

(75) Inventors: Charvaka Duvvury, Plano, TX (US); Gianluca Boselli, Richardson, TX (US); John E. Kunz, Jr., Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/107,033

(22) Filed: Apr. 15, 2005

(65) Prior Publication Data

US 2006/0231897 A1  Oct. 19, 2006

(51) Int. Cl.
*H01L 23/62* (2006.01)

(52) U.S. Cl. ............... 257/355; 257/356; 257/357; 257/358; 257/359; 257/360; 257/361; 257/363

(58) Field of Classification Search ............... None
See application file for complete search history.

(56) References Cited

U.S. PATENT DOCUMENTS 6,646,309 B1 *  11/2003  Chen .................. 257/358
6,690,066 B1 *  2/2004   Lin et al. ............ 257/355
6,858,902 B1 *  2/2005   Salling et al. ....... 257/360
2002/0033507 A1 *  3/2002  Maria Verhaege et al. .. 257/360

* cited by examiner

*Primary Examiner*—Nathan J. Flynn
*Assistant Examiner*—Fazli Erdem
(74) *Attorney, Agent, or Firm*—W. James Brady, III; Frederick J. Telecky, Jr.

(57) ABSTRACT

A semiconductor circuit for protecting an I/O pad against ESD events comprising a pMOS transistor (510) in a first n-well (511) having its source connected to Vdd and the first n-well, and its drain connected to the I/O pad; the transistor has a finger-shaped contact (513) to the first n-well. Further a finger-shaped diode (520) with its cathode (521) located in a second n-well and connected to the I/O pad, and its anode connected to ground. The anode is positioned between the cathode and the first n-well, whereby the finger-shaped anode and cathode are oriented approximately perpendicular to the finger-shaped transistor n-well contact. Further a third finger-shaped n-well (551) positioned between the first n-well and the diode, the third n-well connected to ground and approximately perpendicular to the first n-well contact, acting as a guard wall (550).

8 Claims, 6 Drawing Sheets

GUARDWALL STRUCTURES FOR ESD PROTECTION

FIELD OF THE INVENTION

The present invention is related in general to the field of electronic systems and semiconductor devices and more specifically to the field of electrostatic discharge (ESD) protection of power or signal pads in deep submicron CMOS technologies.

DESCRIPTION OF THE RELATED ART

Integrated circuits (ICs) may be severely damaged by electrostatic discharge (ESD) events. A major source of ESD exposure to ICs is from the human body (described by the "Human Body Model", HBM); the discharge of the human body generates peak currents of several amperes to the IC for about 100 ns. A second source of ESD is from metallic objects (described by the Machine model", MM); it can generate transients with significantly higher rise times and current levels than the HBM ESD source. A third source is described by the "charged device model" (CDM), in which the IC itself becomes charged and discharges to ground in rise times less than 500 ps.

ESD phenomena in ICs are growing in importance as the demand for higher operating speed, smaller operating voltages, higher packing density and reduced cost drives a reduction of all device dimensions. This generally implies thinner dielectric layers, higher doping levels with more abrupt doping transitions, and higher electric fields—all factors that contribute to an increased sensitivity to damaging ESD events.

The most common protection schemes used in metal-oxide-semiconductor (MOS) ICs rely on the parasitic bipolar transistor associated with an nMOS device whose drain is connected to the pin to be protected and whose source is tied to ground. The protection level or failure threshold can be set by varying the nMOS device width from the drain to the source under the gate oxide of the nMOS device. Under stress conditions, the dominant current conduction path between the protected pin and ground involves the parasitic bipolar transistor of that nMOS device. This parasitic bipolar transistor operates in the snapback region under pin positive with respect to ground stress events.

The dominant failure mechanism, found in the nMOS protection device operating as a parasitic bipolar transistor in snapback conditions (the bipolar turn-on at snapback occurs at the collector/drain voltage Vt1 with an associated collector/drain current It1), is the onset of second breakdown at threshold current It2. Second breakdown is a phenomenon that induces thermal runaway in the device wherever the reduction of the impact ionization current is offset by the thermal generation of carriers. Second breakdown is initiated in a device under stress as a result of self-heating. The peak nMOS device temperature, at which second breakdown is initiated, is known to increase with the stress current level. The second breakdown trigger current It2 is widely used as an ESD strength monitor.

In the development of ESD protection devices, pMOS transistors have not attracted much attention due to low β of the parasitic lateral pnp bipolar junction transistor, which results in small snapback and high on-resistance characteristics. As CMOS technology advances, the performance of pMOS in the snapback mode has improved continuously. Further, the pMOS device shows more uniform conduction, if n-well resistivity is sufficiently high, which provides reasonably high It2. While performing satisfactorily in snapback conduction mode has shown promise for the pMOS to be employed as a positive ESD clamp, it can also be turned on inadvertently, leading to competing current paths in I/O circuits, which raises new reliability issues. This failure has been observed even when pMOS transistors have been sized large enough to endure the expected ESD stress.

SUMMARY OF THE INVENTION

A need has therefore arisen to develop a methodology to avoid this malfunctioning. Detailed investigations by the inventors have shown that the inadvertent turn-on of the pMOS transistor is caused by the interaction of the substrate diode at the input/output (I/O) signal pad with the pMOS output pull-up transistor.

One embodiment of the invention is semiconductor circuit for protecting an I/O pad against ESD events, when the I/O pad is located between a power pad and a ground potential pad. The circuit comprises a pMOS transistor in a first n-well having its source connected to the power pad and the first n-well, and its drain connected to the I/O pad; the transistor has a finger-shaped contact to the first n-well. The circuit further has a first finger-shaped diode with its cathode located in a second n-well and connected to the I/O pad, and its anode connected to ground. The anode is positioned between the cathode and the first n-well, whereby the finger-shaped anode and cathode are oriented approximately perpendicular to the finger-shaped transistor n-well contact.

Another embodiment of the invention is another semiconductor circuit for protecting an I/O pad against ESD events, when the I/O pad is located between a power pad and a ground potential pad. The circuit comprises a pMOS transistor in a first n-well having its source connected to the power pad and the first n-well, and its drain connected to the I/O pad; the transistor has a finger-shaped n-well contact. The circuit further has a first finger-shaped diode with its cathode located in a second n-well and connected to the I/O pad and its anode connected to ground, and a third, finger-shaped n-well positioned between the first n-well and the diode. The third n-well is connected to ground.

It is a technical advantage of the invention that the layout techniques specified by the invention can be obtained while the chip integrated circuit layout density can be maintained.

Additional technical advantages of the invention are that the embodiments are easy to manufacture and that they are robust against latch-up during normal operation. Specifically, while guard-walls (an n-type diffusion which collects electrons) have been recommended in literature just for preventing latch-up, the invention uses them for improving ESD protection; consequently, guard-walls can be applied not just for designs with pMOS transistors, but generally for designs with all transistors.

The technical advances represented by the invention, as well as the aspects thereof, will become apparent from the following description of the preferred embodiments of the invention, when considered in conjunction with the accompanying drawings and the novel features set forth in the appended claims.

DETAILED DESCRIPTION OF THE PREFERRED EMBODIMENTS

Figure 1:
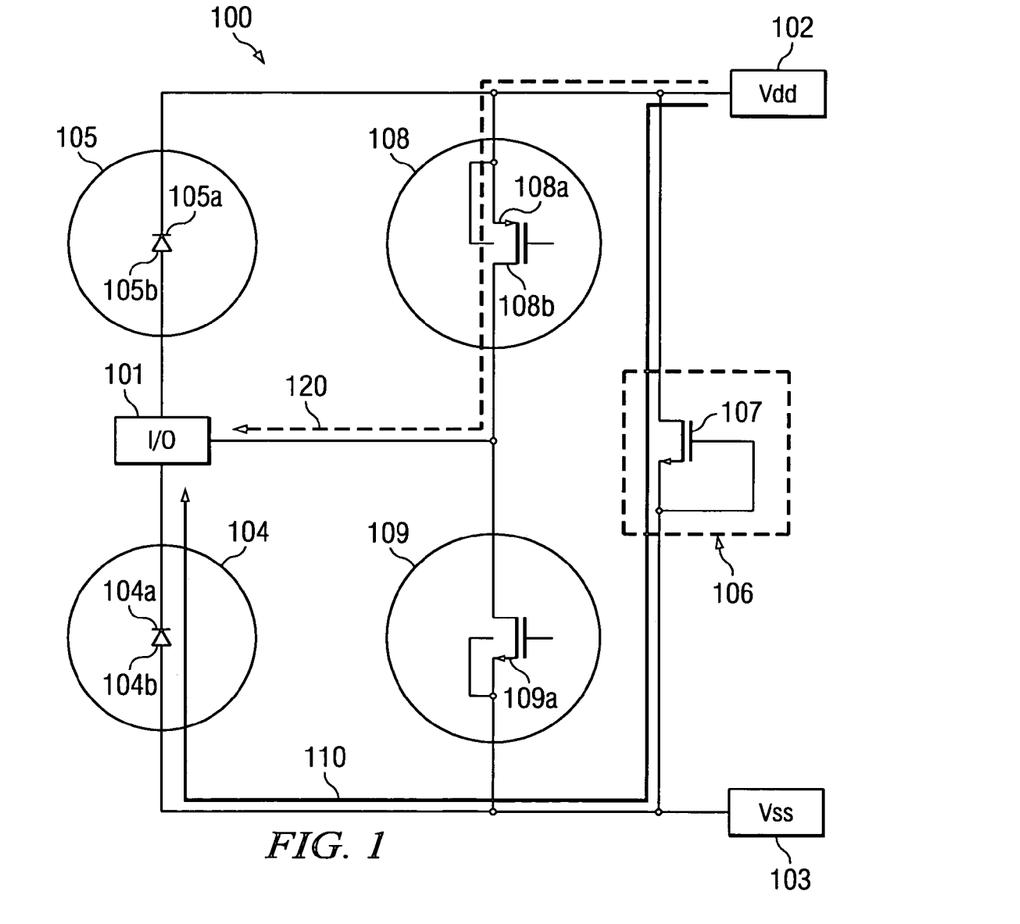
FIG. 1 is a schematic diagram of an ESD protection circuit, in which the pull-up pMOS transistor may unexpectedly fail, when a negative stress is applied between the I/O pad and Vdd.

FIG. 1 illustrates the schematic diagram of a circuit 100 intended to protect signal I/O pad 101 against ESD events. I/O Pad 101 is positioned between power pad (Vdd) 102 and ground potential pad 103 (Vss). First diode 104 has its cathode 104a connected to I/O pad 101 and its anode 104b connected to ground 103. Second diode 105 has its cathode anode 105b connected to I/O pad 101 and its cathode 105a connected to power pad 102.

When the I/O pad 101 is stressed negative with respect to Vdd 102 (or equivalently, when Vdd 102 is stressed positive with respect to I/O pad 101), the stress current is supposed to flow from Vdd pad 102 to I/O pad 101 through power clamp 106 and the negative diode 104 (of the plurality of components inside power clamp 106, FIG. 1 shows only nMOS transistor 107). This stress current flow is symbolized by the solid arrow 110 in FIG. 1.

As an output driver, the circuit in FIG. 1 also contains pull-up pMOS transistor 108 and pull-down nMOS transistor 109. pMOS transistor 108 has its source 108a connected to power pad 102 and to second diode cathode 105a; drain 108b of transistor 108 is connected to I/O pad 101. nMOS transistor 109 has its source 109a connected to ground pad 103 and to first diode anode 104b, and its drain connected to I/O pad 101 and to pMOS transistor drain 108b.

Depending on the effective on-resistance of the stress current path 110 and the applied ESD stress level, the voltage at the Vdd pad 102 can rise high enough to force the pull-up pMOS transistor 108 into the snapback conduction mode, and an alternative current 120 starts to flow and compete with current 110. Current 120 is symbolized by the dashed arrow 120 in FIG. 1. If the on-resistance of pMOS transistor 108 in the snapback mode is low enough to draw a significant amount of current 120, pMOS transistor 108 can reach its second breakdown mode and fail. Photographs and other detail of this failure mechanism have been described in the paper "A pMOSFET ESD Failure Caused by Localized Charge Injection" by Jung-Hoon Chun, Charvaka Duvvury, Gianluca Boselli, Hans Kunz, and Robert W. Dutton, published in Proc. 42nd Internat. Reliab. Phys. Symp., pp. 405–411, 2004.

Figure 2:
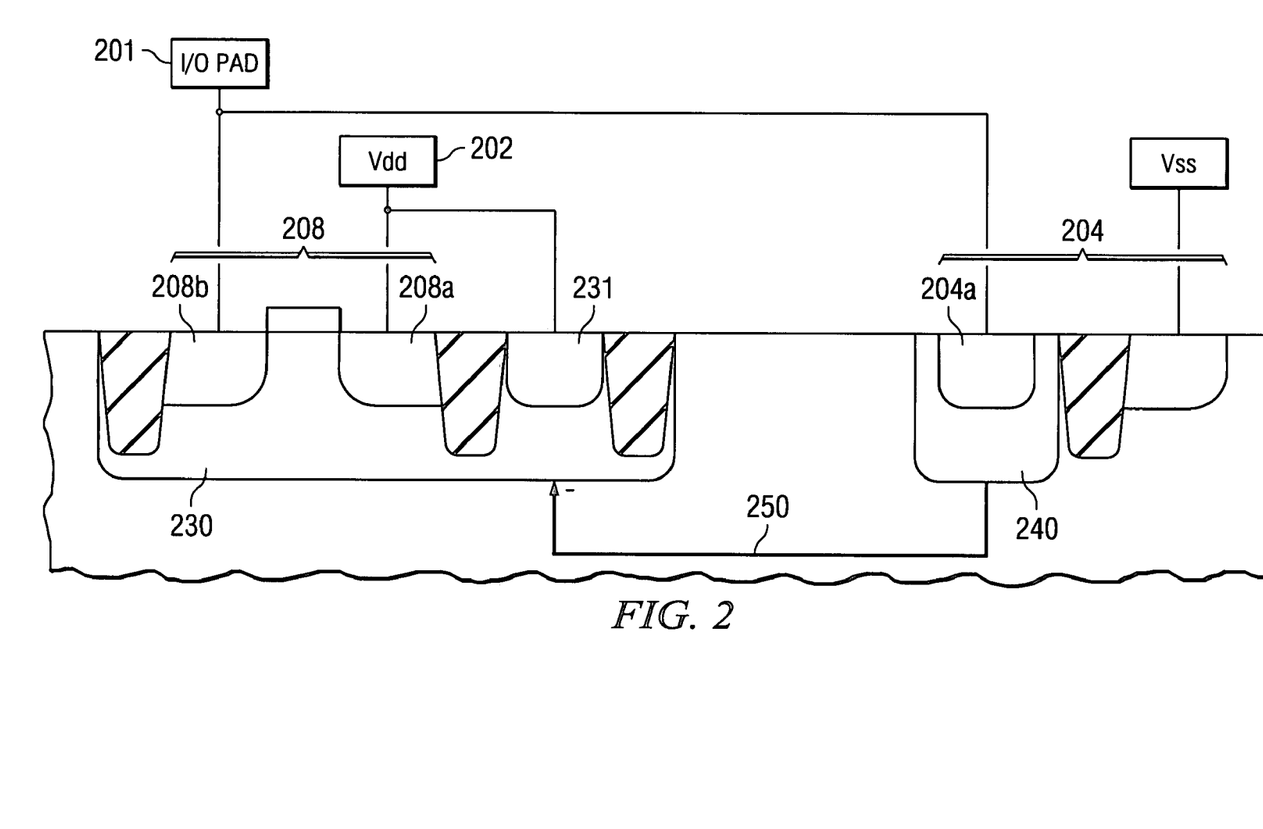
FIG. 2 is a schematic cross section of the layout of the pMOS transistor and substrate diode in the ESD protection circuit displayed in FIG. 1.

The schematic cross section of FIG. 2 illustrates the electron injection that takes place when the I/O pad 201 is stressed to negative polarity with respect to Vdd pad 202 under ESD stress. Equivalently, Vdd pad 202 may be stressed positive with respect to I/O pad 201. pMOS transistor 208 is in first n-type well 230 and has its source 208a connected to Vdd pad 202 and first n-well 230. The drain 208b is connected to I/O pad 201.

FIG. 2 further snows first diode 204. Following the on-going trend for integration and miniaturization of components, design rules for integrated circuits encourage high density of components and thus close proximity of diode cathode 204a, I/O pad 201, and transistor 208. The cathode 204a of first diode 204 is located in second n-well 240 and connected to I/O pad 201.

Under ESD stress, the excess electrons injected from the negative diode 204 at the I/O pad 201 would be collected by first n-well 230 of pMOS transistor 208. This electron current is designated 250 in FIG. 2; it is facilitated by the close proximity of first and second n-wells 230 and 240, following integrated circuit design rules. The electron current 250 is biasing first n-well 230 locally, whereby the pMOS transistor 208, which is not intended for ESD action, could prematurely trigger and fail. Consequently, instead of the designed current path 110 in FIG. 1, excess current would go through parasitic path 120.

The suggestion to eliminate the interaction of electron current 250 by placing diode 204 far from the I/O pad 201 and transistor 208, would have an adverse impact on the layout of any integrated circuit.

Figure 3:
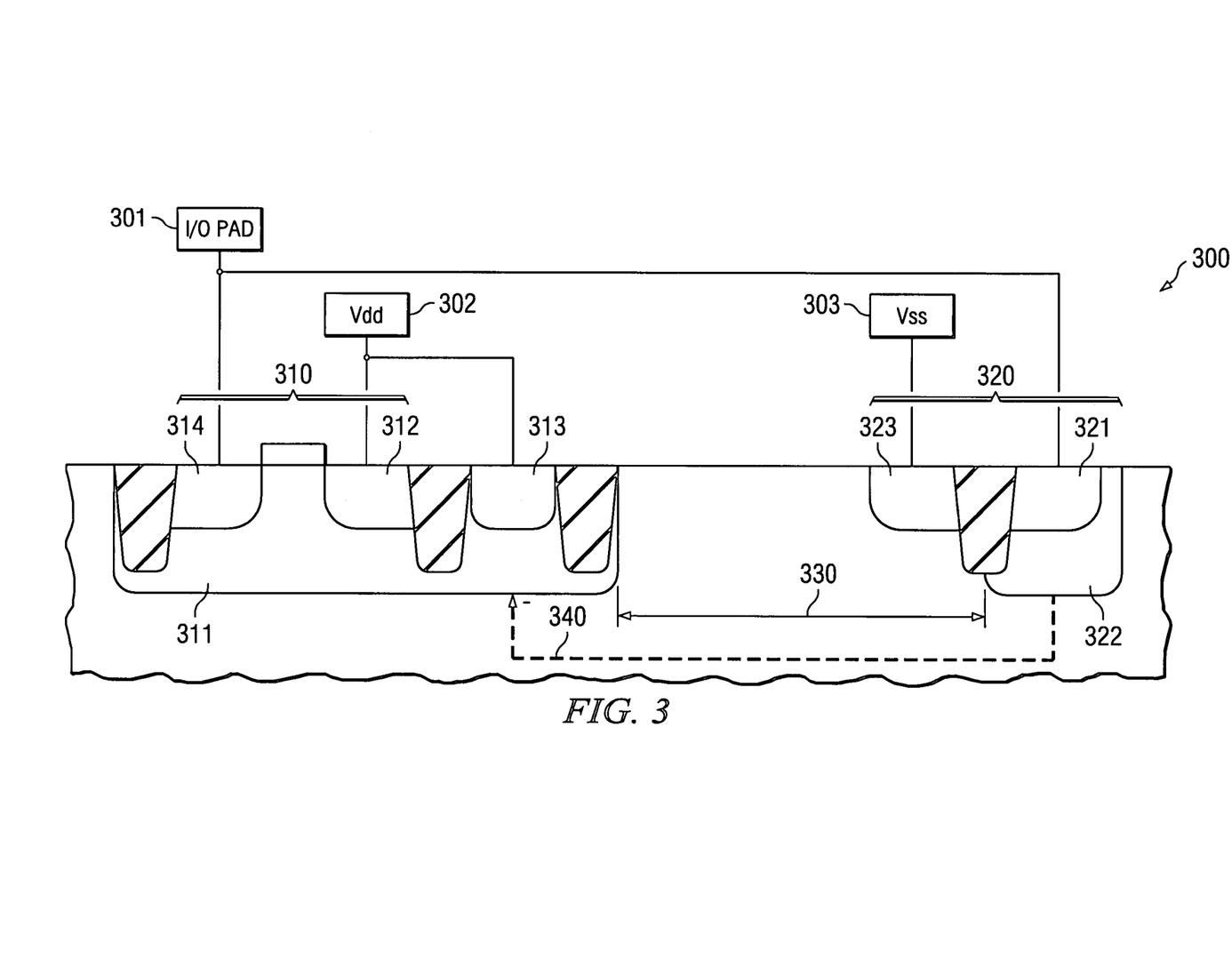
FIG. 3 is a schematic cross section of the layout of a pMOS transistor and substrate diode in the ESD protection circuit according to an embodiment of the invention.

The schematic cross section of FIG. 3 describes an embodiment of the invention for a semiconductor circuit 300 to protect an I/O pad 301 against ESD events. Circuit 300 is fabricated in p-type substrate material. I/O pad 301 is positioned between power pad (Vdd) 302 and ground potential pad (Vss) 303. Circuit 300 comprises a pMOS transistor 310 in a first n-well 311; the transistor is preferably a multi-finger transistor. It has its source 312 connected to the power pad 302 and the first n-well 311; the contact 313 to first n-well 311 is preferably finger-shaped. The transistor drain 314 is connected to I/O pad 301.

Circuit 300 further comprises first diode 320, the substrate diode at the I/O pad, which is preferably finger-shaped. Diode 320 has its cathode 321 located in a second n-well 322; cathode 321 is connected to I/O pad 301, and anode 323 connected to ground 303. As FIG. 3 shows, anode 323 is positioned between cathode 321 and first n-well 311. With this geometrical arrangement, the n-wells 311 and 323 can be kept remote from each other without violating any circuit design layout rules. The preferred distance 330 between n-well 311 and n-well 323 is >5 µm.

Based on the geometrical arrangement of n-well 311, pMOS transistor 310, and diode 320 depicted in FIG. 3, the electron current 340, shown as a dashed arrow in FIG. 3, can be kept so small that its local biasing effect in n-well 311 is negligible.

Figure 4:
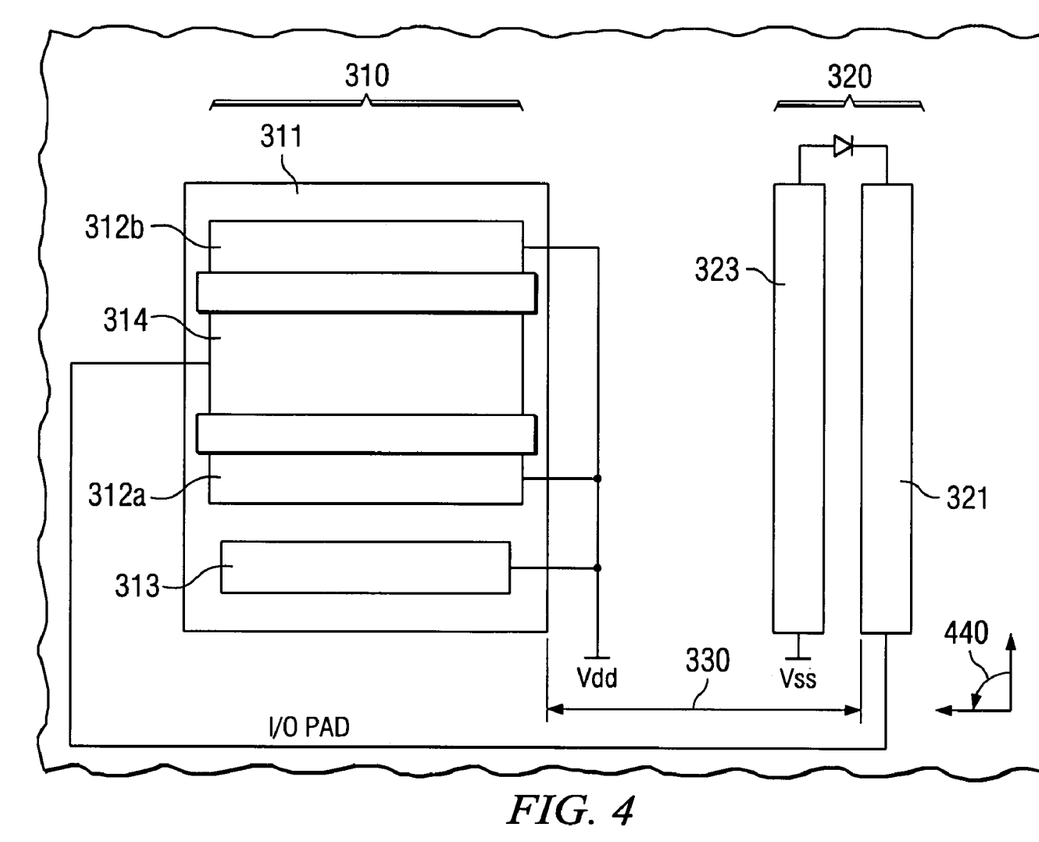
FIG. 4 is a schematic top view of a multi-finger pMOS transistor and finger-shaped substrate diode in an ESD protection circuit incorporating several embodiments of the invention.

Additional geometrical arrangements can create further benefits for safe circuit operation, especially for pMOS transistor 310, and reliable ESD protection. FIG. 4 depicts a schematic top view of the circuit portion shown in FIG. 3. The n-well 311 has a finger-shaped n+ contact 313. The pMOS transistor 310 is shown as a multi-finger transistor, with the source (312a, 312b) and drain (314) fingers oriented parallel to the n-well contact finger 313.

In agreement with FIG. 3, the negative diode 320 is shown in FIG. 4 with its n+ contact 321 remote from n-well 311; the separating distance, designated 330, is preferably >5 µm. In addition, contact 321 is oriented approximately perpendicular to the finger-shaped transistor n-well contact 313. The about normal orientation angle (90°) is designated 440. The purpose of this specific orientation is to help minimizing the flow 340 of electrons from the diode cathode 321 to the transistor n-well 311, and thus to help minimizing any local biasing effect in the n-well.

Figure 5:
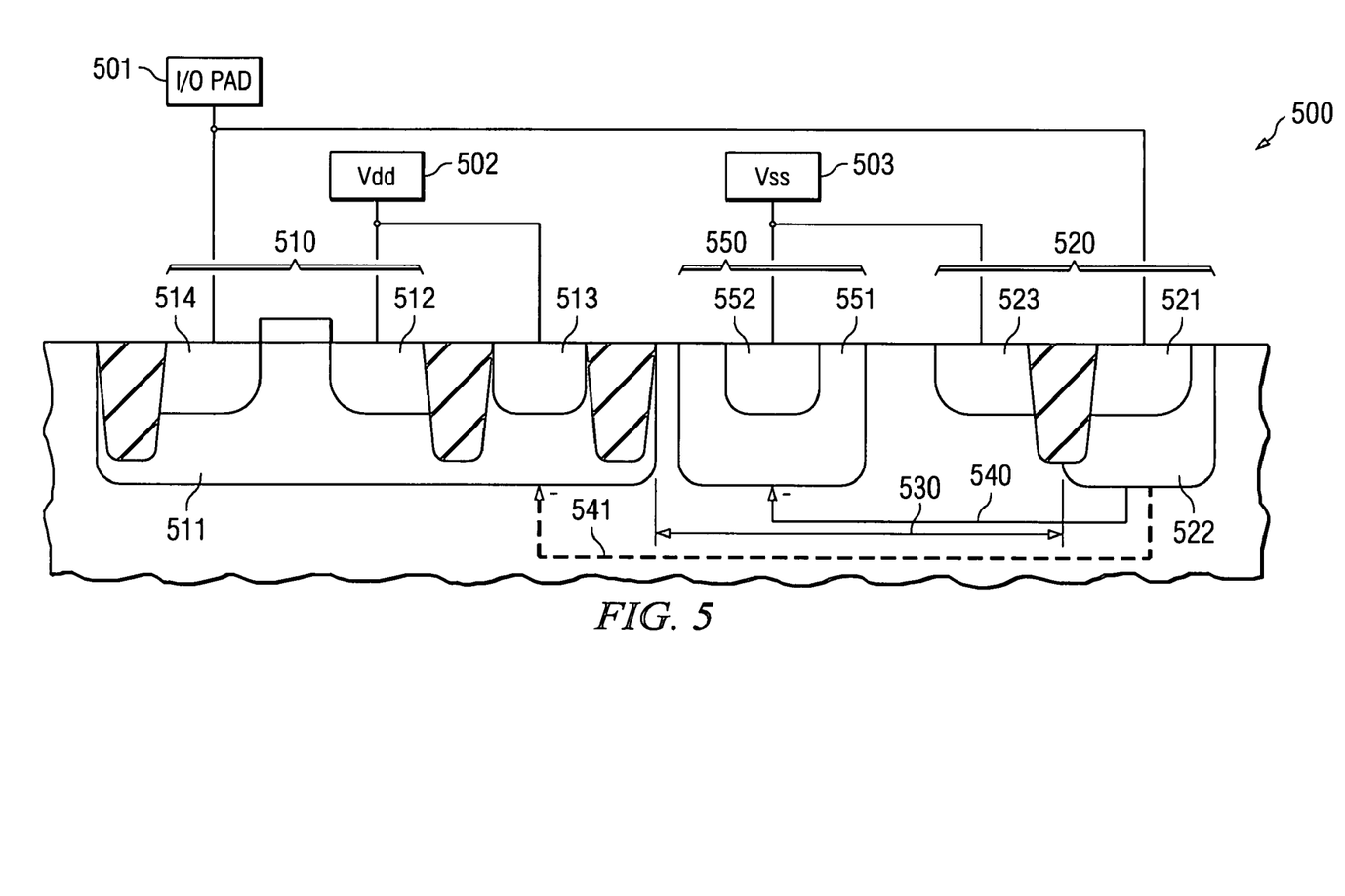
FIG. 5 is a schematic cross section of the layout of a pMOS transistor and substrate diode in the ESD protection circuit according to another embodiment of the invention.

Another embodiment of the invention is illustrated in the schematic cross section of FIG. 5. Semiconductor circuit 500 is fabricated in p-type substrate material. I/O pad 501 is positioned between power pad (Vdd) 502 and ground potential pad (Vss) 503. Circuit 500 comprises a pMOS transistor 510 in a first n-well 511; the transistor is preferably a multi-finger transistor. It has its source 512 connected to the power pad 502 and the first n-well 511; the contact 513 to first n-well 511 is preferably finger-shaped. The transistor drain 514 is connected to I/O pad 501.

Circuit 500 further comprises first diode 520, the substrate diode at the I/O pad, which is preferably finger-shaped. Diode 520 has its cathode 521 located in a second n-well 522; cathode 521 is connected to I/O pad 501, and anode 523 connected to ground 503.

In addition, circuit 500 has a third n-well 551, preferably finger-shaped, which is positioned between first n-well 511 and diode 520. By its contact 552, third n-well 551 is connected to ground Vss 503.

As FIG. 5 shows, the majority 540 of any injected electron current from the diode cathode n-well 522 to transistor n-well 511 is sinking into third n-well 551 and is thus blocked the reach transistor n-well 511. Third n-well 551 is therefore often referred to as a guard wall, or dummy guard wall, and is designated 550 in FIG. 5. Only a small portion 541 of the electron current is able to reach n-well 11, but the local biasing effect is minimized. In contrast to known technology, wherein guard-rings are introduced to prevent latch-up, the guard wall of this embodiment serves to improve ESD robustness, not just in the presence of pMOS transistors, but generally by preventing ESD weakness.

FIG. 5 illustrates another embodiment of the invention, wherein the insertion of guard wall 550 is combined with the remote positioning of diode cathode 521. Diode anode 523 is positioned between cathode 521 and first n-well 511, thus screening the n+ cathode of the substrate diode. With this geometrical arrangement, the n-wells 511 and 523 can be kept remote from each other without violating any circuit design layout rules. The preferred distance 530 between n-well 511 and n-well 523 is >5 μm.

Based on the geometrical arrangement of n-well 511, pMOS transistor 510, diode 520, and the insertion of guard wall 550 depicted in FIG. 5, any injected electron current 541, shown as a dashed arrow in FIG. 5, can be kept so small that its local biasing effect in n-well 511 is negligible.

Figure 6:
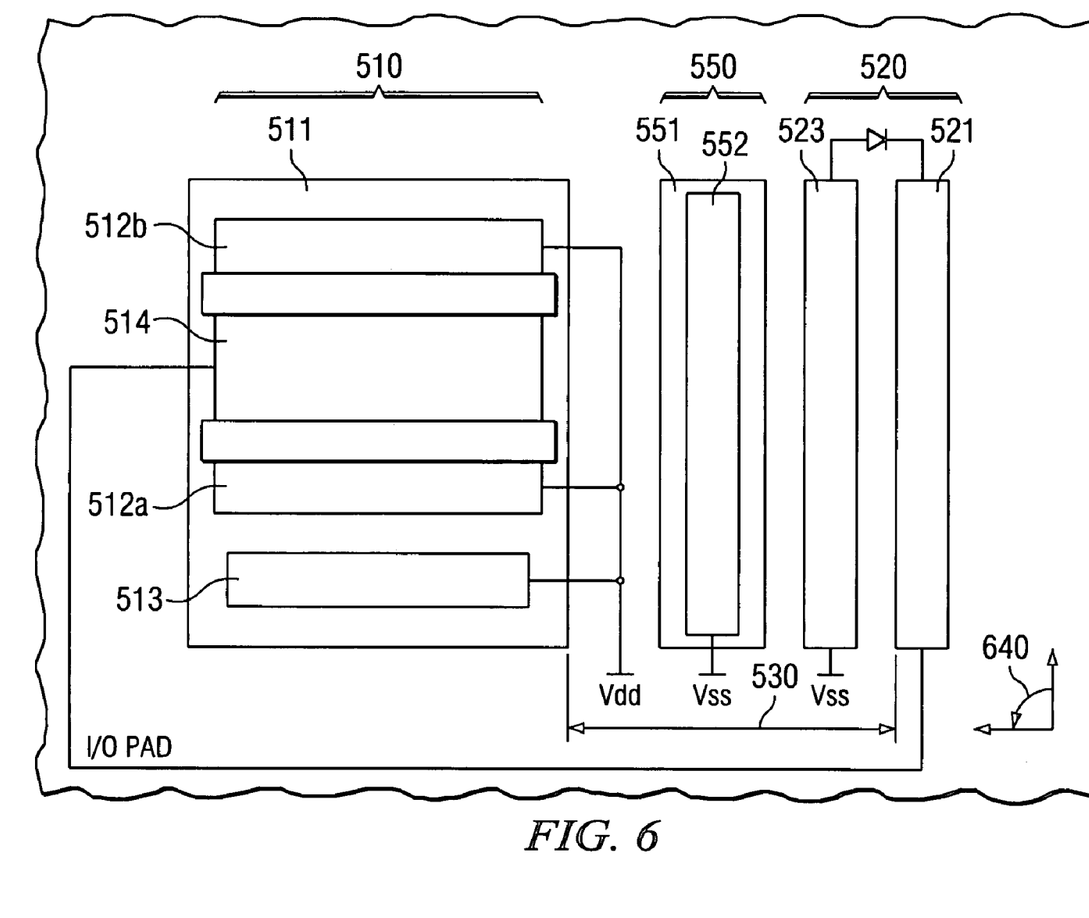
FIG. 6 is a schematic top view of a multi-finger pMOS transistor and finger-shaped substrate diode in an ESD protection circuit incorporating additional embodiments of the invention.

An embodiment with a combination of geometrical arrangements to provide benefits for safe circuit operation, especially for pMOS transistor 510, and reliable ESD protection is illustrated in the schematic top view of FIG. 6. The n-well 511 has a finger-shaped n+ contact 513. The pMOS transistor 510 is shown as a multi-finger transistor, with the source (512a, 512b) and drain (514) fingers oriented parallel to the n-well contact finger 513.

FIG. 6 further shows n-well 551 and contact 552 of the guard wall 550. The guard wall is oriented approximately perpendicular to the finger-shaped transistor n-well contact 513. The about normal orientation angle (90°) is designated 640. The purpose of this specific orientation is to collect the electron injection from the substrate diode; to intersect the majority 540 of electrons flowing from diode cathode 521 to the transistor n-well, and thus to help reducing any local biasing effect in the n-well.

In agreement with FIG. 5, the negative diode 520 is shown in FIG. 6 with its n+ contact 521 remote from n-well 511; the separating distance, designated 530, is preferably >5 μm. In addition, contact 521 is oriented approximately perpendicular to the finger-shaped transistor n-well contact 513. The about normal orientation angle (90°) is designated 640. The purpose of this specific orientation is to help minimizing the flow 541 of electrons from the diode cathode 521 to the transistor n-well 511, and thus to help minimizing any local biasing effect in the n-well.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the embodiments are effective in nMOS transistors as well as in pMOS transistors to improve ESD protection. As another example, the material of the semiconductor material may comprise silicon, silicon germanium, gallium arsenide, or any other semiconductor or compound material used in IC manufacturing. As yet another example, the concept of the invention is effective for many semiconductor device technology nodes and not restricted to a particular one. It is therefore intended that the appended claims encompass any such modifications or embodiments.

We claim:

1. A semiconductor circuit for protecting an input/output (I/O) pad against ESD events, said I/O pad located between a power pad and a ground potential pad, comprising:
    a pMOS transistor in a first n-well having its source connected to said power pad and said first n-well, and its drain connected to said I/O pad, said transistor having a finger-shaped contact to said first n-well; and
    a first finger-shaped diode having its cathode located in a second n-well and connected to said I/O pad, and its anode connected to ground, said anode positioned between said cathode and said first n-well, said finger-shaped anode and cathode oriented approximately perpendicular to said finger-shaped transistor n-well contact.

2. The circuit according to claim 1 wherein said pMOS transistor is a multi-finger transistor.

3. The circuit according to claim 1 further comprising a barrier inserted between said first n-well and said anode for the length of said anode, said barrier comprising a third finger-shaped n-well connected to ground.

4. The circuit according to claim 1 further comprising:
    a second diode having its anode connected to said I/O pad and its cathode to said power pad and said pMOS transistor source;
    a power clamp connected to said power pad and ground; and
    an nMOS transistor having its source connected to ground and said first diode anode, and its drain connected to said I/O pad and said pMOS transistor drain.

5. A semiconductor circuit for protecting an input/output (I/O) pad against ESD events, said I/O pad located between a power pad and a ground potential pad, comprising:
    a pMOS transistor in a first n-well having its source connected to said power pad and said first n-well, and its drain connected to said I/O pad, said transistor having a finger-shaped n-well contact;
    a first finger-shaped diode having its cathode located in a second n-well and connected to said I/O pad, and its anode connected to ground; and a third, finger-shaped n-well positioned between said first n-well and said diode, said third n-well connected to ground.

6. The circuit according to claim 5 wherein said first diode having its anode positioned between its cathode and said first n-well, and its finger-shaped anode and cathode oriented approximately perpendicular to said finger-shaped transistor n-well contact.

7. The circuit according to claim 5 wherein said pMOS transistor is a multi-finger transistor.

8. The circuit according to claim 5 further comprising:
a second diode having its anode connected to said I/O pad and its cathode to said power pad and said pMOS transistor source;
a power clamp connected to said power pad and ground; and
an nMOS transistor having its source connected to ground and said first diode anode, and its drain connected to said I/O pad and said pMOS transistor drain.

* * * * *